United States Patent [19]
Kuhn

[11] Patent Number: 5,418,409
[45] Date of Patent: May 23, 1995

[54] COMPARATOR CIRCUIT FOR TRIGGERING A SWITCHING PROCESS WHEN A VARIABLE MEASUREMENT SIGNAL PASSES THROUGH A SWITCHING THRESHOLD

[75] Inventor: Fritz Kuhn, Waldkirch, Germany

[73] Assignee: Erwin Sick GmbH Optik-Elektronik, Waldkirch, Germany

[21] Appl. No.: 82,676

[22] Filed: Jun. 24, 1993

[51] Int. Cl.[6] .................. H03K 5/22; H03K 5/153; H03K 3/29
[52] U.S. Cl. ........................................ 327/78; 327/205
[58] Field of Search ............... 307/290, 359, 354, 360

[56] References Cited
U.S. PATENT DOCUMENTS

| | | | |
|---|---|---|---|
| 4,618,770 | 10/1986 | Maile | 307/360 |
| 4,639,681 | 1/1987 | Hasegawa | 307/360 |
| 5,019,722 | 5/1991 | Hess | 307/354 |
| 5,097,147 | 3/1992 | Stuebing | 307/360 |

*Primary Examiner*—William L. Sikes
*Assistant Examiner*—Tiep H. Nguyen
*Attorney, Agent, or Firm*—Townsend and Townsend Khourie and Crew

[57] ABSTRACT

A comparator circuit having a signal input and at least one signal output having an ON-state and an OFF-state, wherein the ON-state represents an input signal lying above a pre-given switching level $V_s$ and the OFF-state represents an input signal lying below the switching level $V_s$. The comparator circuit has two comparators, the signal inputs of which are each acted upon by the input signal, wherein both the comparators are wired together in such a way that a switching on of the first comparator produces a signal corresponding to the ON-state of the comparator circuit and the switching off of the second comparator produces a signal corresponding to the OFF-state of the comparator circuit.

19 Claims, 5 Drawing Sheets

COMPARATOR CIRCUIT FOR TRIGGERING A SWITCHING PROCESS WHEN A VARIABLE MEASUREMENT SIGNAL PASSES THROUGH A SWITCHING THRESHOLD

BACKGROUND OF THE INVENTION

The invention relates to a comparator circuit for triggering a switching event when a rising or falling electrical signal passes through a switching threshold. The comparator circuit comprises a signal input and at least one signal output and has a first switching state and a second switching state, wherein the first switching state represents a level of the input signal lying above the switching threshold and the second switching state represents a level of the input signal lying below the switching threshold.

Comparator circuits of this kind can be used in many applications. Fundamentally, they are suited to establishing whether the level of an input signal lies above or below a pre-given threshold value.

A problem with known comparator circuits is that they suffer from hysteresis as a result of measures taken to eliminate harmful influences of noise signals.

When the input signal is hovering around the threshold value and additionally has for example noise or interference superposed on it, the signal is continually passing through the threshold value. In order to prevent the subsequently resulting multiple switching of the comparator arrangement, the comparator circuit is given an hysteresis, wherein in the amplitude of the hysteresis is tailored to the amplitude of the noise signal. A comparator circuit of this kind switches on whenever the upper hysteresis value lying above the threshold value is exceeded and switches off whenever the lower hysteresis value lying below the threshold value is undershot. Consequently, a fluctuation of the input signal between the upper and lower hysteresis values caused by an interference signal does not cause any undesirable switching events.

As well as this desired effect, there results also however the disadvantage that the on-switching level of the comparator circuit is not equal to its off-switching level.

That is to say, known comparator circuits afflicted with hysteresis display a different switching behaviour depending upon the side from which the input signal approaches the switching threshold. This brings considerable associated problems for electronic switching arrangements when it is required or desirable that switching occurs exactly at a pre-given switching threshold independently of the sign of the change in the input signal.

In particular, the use of known comparator circuits afflicted with hysteresis is disadvantageous when they are used in a light detector serving for signalling a traversing object. In this case, depending on the direction from which the object comes, input signal changes of different sign or alternatively falling and rising input signals are supplied to the comparator circuit. Therefore, known comparator circuits switch at different switching thresholds depending on the direction from which the object comes.

SUMMARY OF THE INVENTION

The object of the present invention is to construct a further comparator circuit of the initially named kind which, on the one hand, always switches at exactly the same switching threshold independently of whether it is a rising or a falling input signal which is passing through the switching threshold and, on the other hand, which is insensitive to the influence of interference signals.

The object is satisfied in a comparator circuit of the initially named kind in that a first comparator and a second comparator are provided in the comparator circuit, each comparator having at least one signal input, one reference input and one signal output. The signal inputs of each comparator being acted upon by a signal $U_E$ and the reference inputs of each comparator being switched in such a manner that the first comparator switches on when the switching threshold is exceeded and switches off when a first auxiliary threshold is undershot. The first auxiliary threshold is chosen to be smaller than the switching threshold and in such a manner that the second comparator switches on when a second auxiliary threshold is exceeded, the second auxiliary threshold being chosen to be larger than the switching threshold and switches off when the switching threshold is undershot.

The comparator circuit is further characterized in that the signal outputs of both the first comparator and of the second comparator are connected to a logic circuit which produces an output signal of the logic circuit corresponding to the ON-state of the comparator circuit when the first comparator is switched on and which produces an output signal of the logic circuit corresponding to the OFF-state of the comparator circuit when the second comparator is switched off. The difference between these first and second auxiliary thresholds is chosen to be sufficiently large so that an unstable switching behaviour of the comparator circuit caused by interference signals superposed on the input signal is avoided.

An exact switching behaviour of the comparator circuit in accordance with the invention is achieved in this manner, since the switching event is always triggered exactly at the point at which the pre-given switching threshold is passed through, independently of whether the input signal approaches the switching threshold from above or from below.

The auxiliary thresholds can therefore be straightforwardly set so that an interference signal contained in the input signal does not give rise to undesired switching events.

The developments of the invention serve to separate off the constant contribution of the input signal of the comparator circuit with a capacitor, to establish the working point of the circuit at the threshold value $V_s$ and simultaneously to ensure that the on-switching level of the first comparator is the same as the off-switching level of the second comparator. In this case the comparator circuit always switches when the input signal $U_E$ passes through the zero value whether it be from above or below.

It is however possible to operate without the capacitor, wherein, in this case, one switching event is triggered whenever $U_E$ passes through the threshold value $V_s$ from above or below.

A preferred circuit for controlling the reference inputs of both the comparators is also claimed. With this circuit, it is possible to realise switching of the reference inputs in accordance with the invention with simple circuit means at a favourable cost and economically.

A possible embodiment of the logic circuit referred to in the main claim is also claimed. These circuit variants are described in detail in the description of preferred embodiments.

Measures are also claimed which disclose how an exact switching behaviour of the comparator circuit in accordance with the invention can still be achieved even when a rising input signal of the comparator circuit exceeds the switching threshold $V_s$ but however subsequently before reaching the voltage $V_H$ falls below the voltage $V_L$ again, or alternatively when a falling input signal falls below the switching threshold $V_s$ but however subsequently rises to a voltage lying above $V_H$ again, without having previously fallen below the voltage $V_L$. How a concrete embodiment for realising the circuit described in the claims could look is described in the description of FIG. 6.

A simple measure for compensating for a noise signal which may be superposed on the input signal of the circuit arrangement is also claimed.

The use of a comparator circuit in accordance with the invention in a light detector for signalling the presence of an object in a plane of detection at a pre-given distance from the light detector is especially advantageous, as is described in the claims.

When using light detectors which incorporate previously known comparator circuits, it is a problem that it cannot be exactly established when the object lies in the plane of detection. In particular, errors occur if comparator circuits afflicted with hysteresis are used whenever an object, which is for instance placed on a conveyor belt, may approach the plane of detection from different directions. The errors described can be eliminated by the use of a comparator circuit in accordance with the invention.

It is especially advantageous if the light detector comprises a light emitter and two neighbouring light receivers which receive the light reflected from the object, wherein, when the object is approaching the light detector, light is initially only detected by one light receiver, then from both light receivers in each case to a contribution varying with the distance of the object and subsequently only by the second light receiver, wherein the object is located in the plane of detection when both light receivers receive approximately the same light contribution.

When an object moves through the plane of detection in such an arrangement, a spot of light reflected off the object and corresponding to the movement of the object scans over both the light receivers provided in the light detector.

Preferably, the difference signal from the signals delivered from both light receivers is supplied as input signal to the comparator circuit present in the light detector. The summation signal of the two signals delivered by the light receivers can additionally be used for processing in order to be able to differentiate whether both light receivers currently receive the same contribution of reflected light when using the difference signal and thus whether the object lies in the plane of detection or whether currently no light is being reflected from the object to the light detector. If the summation signal is not equal to zero and the difference signal is equal to zero, an object is present in the plane of detection. If the difference signal and the summation signal are both equal to zero no light is being reflected to the light detector. Therefore, in this latter case, no object will register at the output of the light detector as a result of the absence of a summation signal, even though the difference signal is equal to zero.

It is advantageous when the light detector functions with pulse-shaped light since in this manner any optical interference signals which may be present are easier to overcome. In this case, the clock signals of the D-type flip-flops provided in the circuit arrangement in accordance with the invention can be derived from the frequency of the pulse-shaped optical signals emitted. It is advantageous if the clock signal of the D-type flip-flops is delayed relative to that of the emitted light clocking.

BRIEF DESCRIPTION OF DRAWINGS

The invention will now be described in more detail with the aid of the drawings which show.

DESCRIPTION OF PREFERRED EMBODIMENTS

Figure 1:
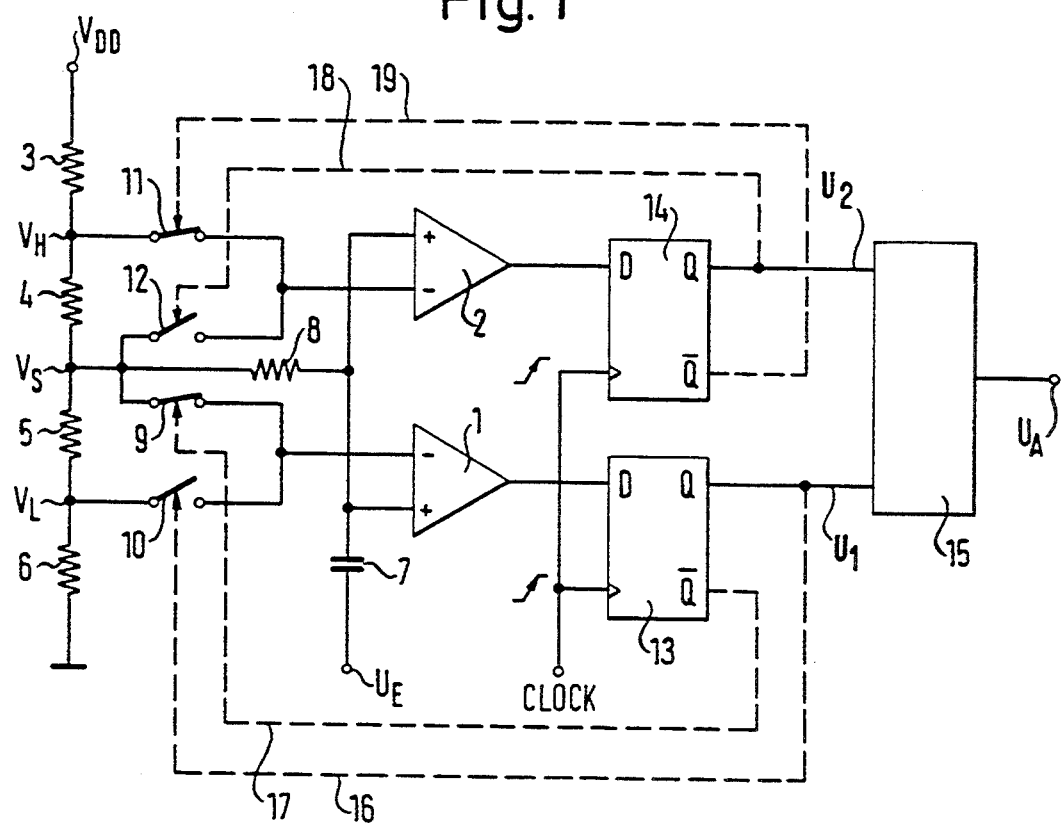
FIG. 1 a possible embodiment of a comparator circuit in accordance with the invention.

FIG. 1 shows a first comparator 1 and a second comparator 2 which each have one signal input labelled "+" and one reference input labelled "−".

Furthermore, a voltage divider lying between earth and a fixed DC-voltage $V_{DD}$ which consists of the resistances 3, 4, 5 and 6 and which delivers voltages $V_L$, $V_s$ and $V_H$ which define a first auxiliary threshold, a switching threshold and a second auxiliary threshold respectively.

The signal $U_E$ to be processed with regard to its level in relation to the switching threshold is applied in parallel to both signal inputs of the comparators 1 and 2. Furthermore, the signal inputs of both comparators 1 and 2 are connected via a resistance 8 to the voltage $V_s$ of the voltage divider 3, 4, 5, 6 which defines the switching threshold.

The reference input of the first comparator 1 is actuatable via two exclusively activatable switches 9, 10 either with the voltage $V_s$ corresponding to the switching threshold or with the voltage $V_L$ corresponding to the first auxiliary threshold.

The reference input of the second comparator 2 is actuatable via two exclusively activatable switches 11, 12 either with the voltage $V_s$ corresponding to the switching threshold or with the voltage $V_H$ corresponding to the second auxiliary threshold.

The outputs of the comparators 1 and 2 are fed to the signal inputs of D-type flip-flops 13 and 14 respectively.

Both the outputs Q of the D-type flip-flops 13, 14 which deliver the output signals $U_1$ and $U_2$ are connected with a logic circuit 15 delivering an output signal $U_A$.

Both D-type flip-flops 13, 14 are actuated with the same clock signal, wherein the positive clock edge is used for both flip-flops.

The output Q and an additionally provided complementary or inverse output $\overline{Q}$ of the first D-type flip-flop 13 control both the switches 9, 10 in an exclusive manner via connections 16, 17. In analogous manner, the output Q and an additionally provided complementary or inverse output $\overline{Q}$ of the second D-type flip-flop 14 control both the switches 11, 12 in an exclusive manner via control connections 18, 19.

In the following, the mode of operation of the described comparator circuit in hand is described also with reference to FIG. 2:

The signal $U_E$ is shown here as a single pulse but can however also have any other form, in particular also the form of a pulse train.

As long as the signal $U_E$ to be discriminated has a level which is smaller than the voltage $V_L$ corresponding to the first auxiliary threshold, the switches 9 and 11 are closed while the switches 10 and 12 are open. Thus the voltage $V_s$ corresponding to the second auxiliary threshold is applied to the reference input of the first comparator 1 and the voltage $V_H$ corresponding to the switching threshold is applied to the reference input of the second comparator 2. Consequently, the outputs of both comparators 1, 2 find themselves in the logic state L, i.e. they are, according to the terminology used here, switched off. The L also awaits at the corresponding output Q of the D-type flip-flop 13, 14 and, on the one hand, keeps the switches 9, 11 closed while, on the other hand, the output signal $U_A$ of the logic circuit 15 is also L.

This state is still maintained when the signal $U_E$ exceeds the voltage $V_L$ and approaches $V_s$.

As soon as the signal $U_E$ exceeds the voltage $V_s$, the first comparator 1 switches on and then sets the D-type flip-flop 13 at the output Q to H and at the complementary output $\overline{Q}$ to L. The switch 9 is thereby opened and the switch 10 closed so that the voltage $V_L$ is now applied at the reference input of the first comparator 1. The logic circuit 15 now switches the output signal $U_A$ to H.

If the input signal $U_E$ rises further and as a result also rises above the voltage $V_H$, the second comparator 2 switches on and sets the output Q of the D-type flip-flop 14 to H and the complementary output $\overline{Q}$ to L. The switch 11 is thereby opened and the switch 12 closed so that the voltage $V_s$ is now applied at the reference input of the second comparator 2. The output signal $U_A$ does not however change due to the corresponding construction of the logic circuit 15.

This state remains maintained as long as the input signal $U_E$ is larger then $V_s$.

If now the input signal $U_E$ falls below the voltage $V_s$ corresponding to the switching threshold, the second comparator 2 switches off since its reference input is actuated by the voltage $V_s$. The output signal L of the comparator 2 now prevailing sets the output Q of the D-type flip-flop 14 correspondingly to L, whereupon the switches 11, 12 are changed once more into the state shown in FIG. 1 and the logic circuit 16 which reacts to the output signal L at the output Q of the second comparator 2, adopts the state L at the output $U_A$.

If, in the following, the input signal $U_E$ reduces further and falls below the voltage value $V_L$, the first comparator 1 also switches off whereupon the D-type flip-flop 13 is correspondingly reset and then also the switches 9 and 10 are changed once more into the state shown in FIG. 1. The output signal $U_A$ of the logic circuit 15 does not change during this.

From the above described switching events it is clear that the output signals $U_1$ and $U_2$ of both D-type flip-flops 13 and 14 are connected in a logic circuit 15 in such a way that a switching on of the first comparator results in a switching on of the entire comparator circuit and that a switching off of the second comparator effects a switching off of the entire comparator circuit. Thus, the signals $U_1$ and $U_2$ are made interdependent by the logic circuit 15 in such a manner that the output signal $U_A$ shown in FIG. 2 is maintained. With reference to the on-switching event of the entire comparator circuit, the output signal $U_A$ follows the signal $U_1$ and with reference to the off-switching event of the entire comparator circuit, the output signal $U_A$ follows the signal $U_2$.

As a result of this, a first comparator 1 is made available for the rising input signal, the first comparator 1 being switched on when the input signal rises above the switching threshold, and a second comparator 2 is made available for the falling input signal, the second comparator being switched off when the input signal falls below the switching threshold, wherein the resetting and setting of the comparators 1 and 2 respectively which is required for the continuous operation takes place via auxiliary thresholds lying above or below the switching threshold respectively.

In this manner it is achieved that the comparator circuit always switches on or off exactly when the switching threshold $V_s$ is passed through from below or above respectively, wherein, however, fluctuations in the input signal $U_E$ between the voltage levels of the two auxiliary thresholds $V_L$ and $V_H$ caused by an interference signal do not lead to undesired switching events.

For compensating for a noise signal having a noise level ($U_R$) which is superposed on the input signal ($U_E$), the various thresholds are adjusted. The on-switching threshold for the first comparator 1 is adjusted to be the average of the switching voltage ($V_S$) and the noise level ($U_R$). The on-switching threshold for the second comparator 2 is adjusted to be the average of a second auxiliary threshold voltage ($V_H$) and the noise level ($U_R$). The off-switching threshold for the first comparator 1 is adjusted to be half of the difference between the first auxiliary threshold voltage ($V_L$) and the noise level ($U_R$). The off-switching threshold for the second comparator 2 is adjusted to be half the difference between the switching voltage ($V_S$) and the noise level ($U_R$).

Figure 3:
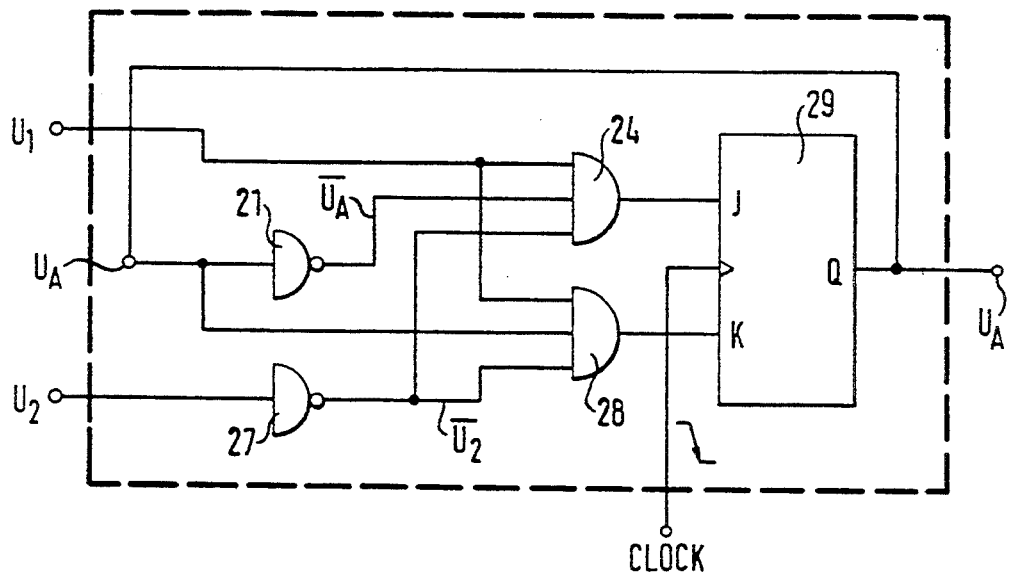
FIG. 3 a possible embodiment of the logic circuit shown schematically in FIG. 1.

A possible embodiment of the logic circuit 15 is shown in FIG. 3.

The three inputs of an AND-gate 24 are occupied with the output signal $U_1$ of the first D-type flip-flop 13, with the signal $\overline{U_A}$ inverted by an inverter 21 and with the output signal $\overline{U_2}$ of the second D-type flip-flop 14 inverted by an inverter 27. The output signal of the AND-gate is fed to the J-input of JK-flip-flop 29.

The three inputs of a further AND-gate 28 are actuated by the signals $U_1$, $U_A$ and by the signal $\overline{U_2}$ inverted by the inverter 27. The output signal of the AND-gate 28 is fed to the K-input of the JK-flip-flop 29.

The output signal $U_A$ of the comparator circuit is taken off at the output Q of the JK-flip-flop 29. The JK-flip-flop 29 is actuated by a clock signal which is generated from the signal change from $U_1$ and/or $U_2$.

A change in the output signal $U_A$ of the logic circuit 15 does not directly ripple through to the inputs of the flip-flop 29 via the input signal $U_A$ of the logic circuit 15, because the flip-flop 29 is a master-slave-flip-flop in which inputs are switched by the rising edge of the clock signal and outputs are switched afterwards by the falling edge of the clock signal. Any change in the output signal $U_A$ can therefore be first felt at the inputs of the flip-flop 29 at the first clock signal following the change.

Through this logic circuit 15 it is achieved that the discontinuous rise of the signal $U_1$ from L to H results in a discontinuous rise of the output signal $U_A$ and that a discontinuous fall of the signal $U_2$ from H to L effects a discontinuous fall of the output signal $U_A$. The output signal $U_A$ of the comparator circuit containing the logic circuit 15 thus follows the signal $U_1$ with regard to its on-switching event and the signal $U_2$ with regard to its off-switching event.

Problems can occur when using the described logic circuit 15, if the input signal $U_E$ falls below the voltage $V_s$ and subsequently, without having fallen below $V_L$, rises once more above $V_s$ or $V_H$. In this case, the comparator circuit would indeed show the reduction of the input signal $U_E$ to below $V_s$ however would not react further when $V_s$ or $V_H$ are exceeded.

Problems could also occur when an input signal $U_E$ rises above the voltage $V_s$ and subsequently, without having reached $V_H$, reduces once more below $V_s$ or $V_L$. In this case, the comparator circuit would show the rising above $V_s$ however would not show the subsequent falling below $V_s$ or $V_L$.

Both these cases described above are not particularly relevant in practice, however, in spite of this, a possibility ought to be shown as to how the corresponding difficulties could be circumvented.

Figure 2:
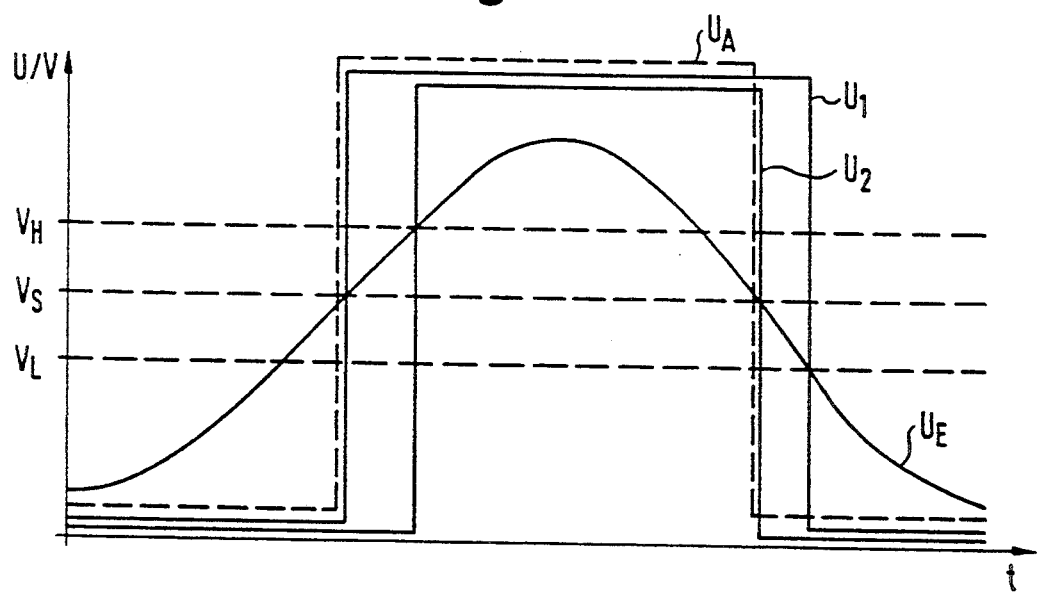
FIG. 2 the output voltage profiles $U_1$, $U_2$ and $U_A$ in accordance with FIG. 1 for a pre-given input signal $U_E$ from a single pulse.
Figure 4:
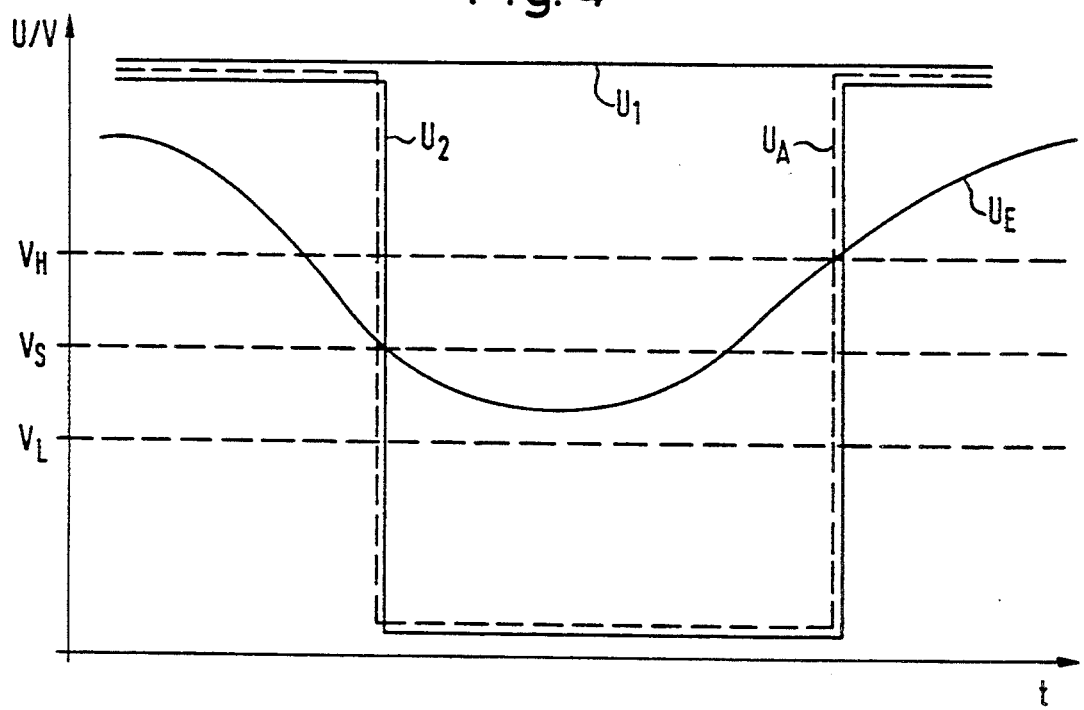
FIG. 4 the voltage profiles $U_1$, $U_2$ and $U_A$ for a pre-given input signal $U_E$ and when using an additional circuit in accordance with FIG. 6.
Figure 5:
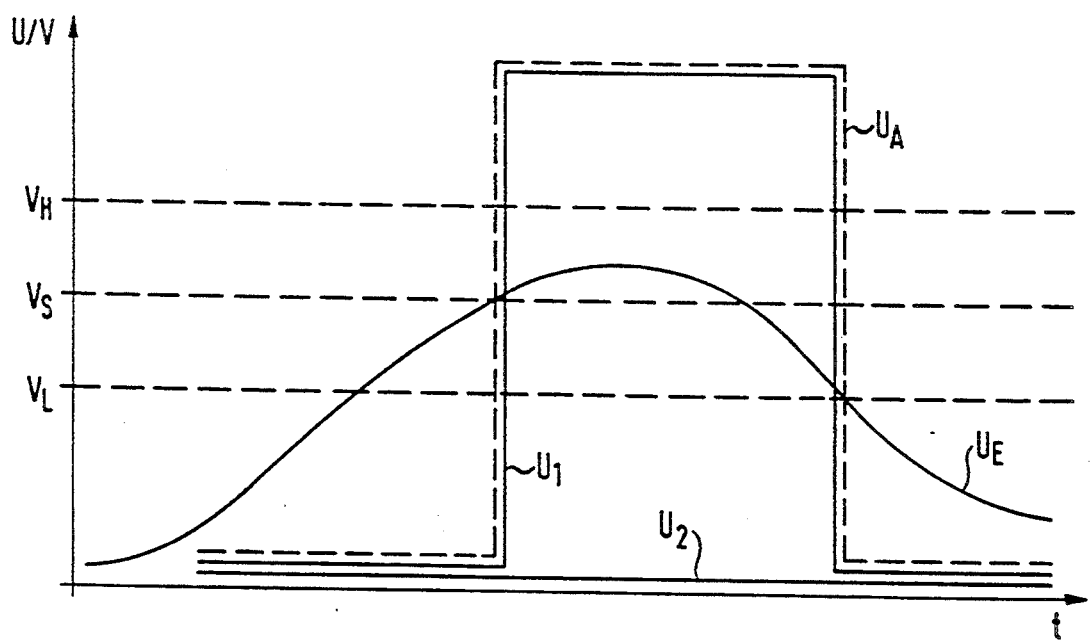
FIG. 5 further voltage profiles $U_1$, $U_2$ and $U_A$ for a pre-given input signal $U_E$ and when using an additional circuit in accordance with FIG. 6.

By modification of the logic circuit 15 not only the voltage profiles shown in FIG. 2 but also those in accordance with FIGS. 4 and 5 can be achieved.

FIG. 4 shows an input voltage profile $U_E$ which reduces to below $V_s$, which does not reach $V_L$ and subsequently climbs once more above $V_H$. By a special construction of the logic circuit 15 it can be achieved that, in this case, the output voltage $U_A$ follows the voltage $U_2$ also with regard to the on-switching event, whereby, in the special case shown, a switching on of the comparator circuit is achieved when the voltage $V_H$ is exceeded, although in the normal case the output voltage $U_A$ follows the voltage $U_1$ with regard to the on-switching event. Analogously the voltage profiles are shown in FIGS. 5 for the case in which the input voltage climbs above the value $V_s$, does not reach $V_H$ and subsequently reduces once more to below $V_L$. In this case, the output voltage follows the voltage $U_1$ with regard to the off-switching event although in the normal case a fall of the voltage $U_2$ effects the switching off of the comparator circuit.

Figure 6:
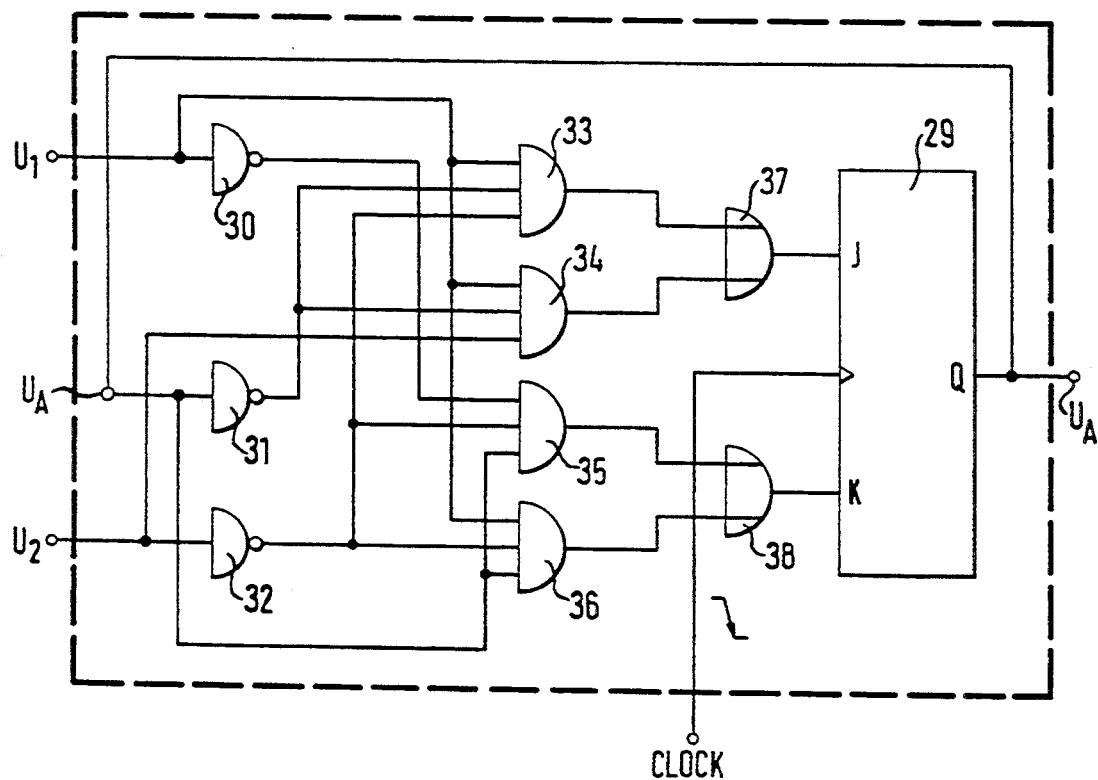
FIG. 6 an additional circuit which is usable optionally in conjunction with the logic circuit in accordance with FIG. 3 for achieving the output voltage profiles of FIGS. 4 and 5.

The voltage profiles shown in FIGS. 4 and 5 can, with the addition of the logic circuit 15, be made into a further logic circuit 15' in accordance with FIG. 6.

A first AND-gate 33 with three inputs is actuated by the signals $U_1$, by the signal $\overline{U}_A$ inverted by an inverter 31 and by the signal $\overline{U}_2$ inverted by an inverter 32.

A second AND-gate 34 with three inputs is actuated by the signal $U_1$, by the signal $\overline{U}_A$ inverted by the inverter 31 and by the signal $U_2$.

A third AND-gate 35 with three inputs is actuated by the signal $\overline{U}_1$ inverted by an inverter 30, by the signal $\overline{U}_2$ inverted by the inverter 32 and by the signal $U_A$.

A fourth AND-gate 36 with three inputs is actuated by the signals $U_1$, by the signal $\overline{U}_2$ inverted by the inverter 32 and by the signal $U_A$.

The output signals of both the AND-gates 33 and 34 are fed to both inputs of an OR-gate 37.

The output signals of both the AND-gates 35 and 36 are fed to both the inputs of a further OR-gate 38.

The output signal of the OR-gate 37 is connected to the J-input of a JK-flip-flop 29, whereas the output of the OR-gate 38 is applied to the K-input of this flip-flop.

The signal applied at the output Q of the JK-flip-flop 29 forms the output signal $U_A$ of the comparator circuit.

The JK-flip-flop 29 is actuated by a clock signal which is generated from the signal change from $U_1$ and/or $U_2$.

With the circuit 15' described in accordance with FIG. 6, not only the signal profiles in accordance with FIG. 2, but also those of FIGS. 4 and 5 can be achieved.

The circuit solutions shown in FIGS. 1, 3 and 6 represent purely examples for the realisation of the circuit in accordance with the invention there are however also a large number of other circuit solutions possible.

Figure 7:
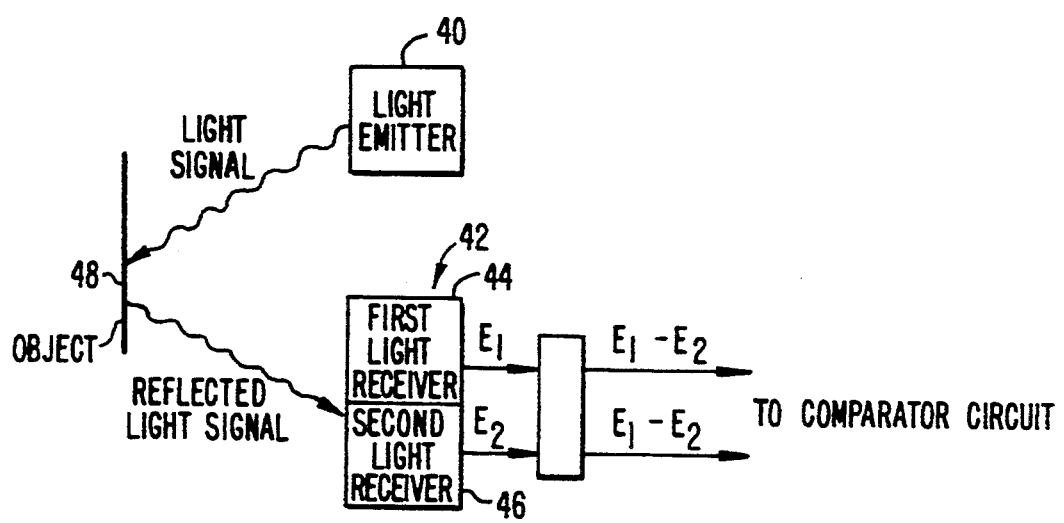
FIG. 7 apparatus for signalling in accordance with the invention the presence of an object in a plane of detection at a pre-given distance from a light detector.

FIG. 7 shows an apparatus for signalling in accordance with the invention the presence of an object in a plane of detection at a pre-given distance from a light detector. The apparatus includes a light emitter 40 and a light detector 42 including a first light receiver 44 and a second light receiver 46. An object 48 is also shown.

FIG. 8 shows possible output voltage profiles from light receivers disposed in a light detection apparatus in which the comparator circuit in accordance with the invention can be used.

This could for instance be related to apparatus for signalling the presence of an object in a plane of detection at a pre-given distance from the light detector as shown in FIG. 7.

The comparator circuit in accordance with the invention can be used in this kind of light detector in a particularly advantageous manner, since these light detectors are then in a position to determine when an object is located in the plane of detection in an extremely exact manner and independently of the degree of reflection, in particular of diffuse reflection, from the object.

As already referred to, it is especially advantageous to equip the light detector 42 with two neighbouring light receivers 44, 46 wherein the spot of light reflected from the object 48 when the object 48 approaches the light detector 42 passes over both light receivers 44, 46 one after the other.

Figure 8A:
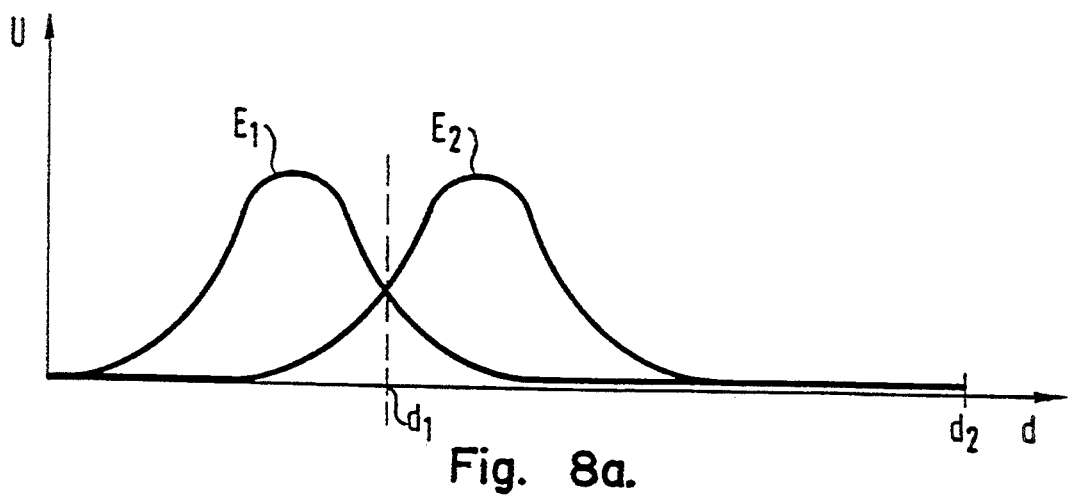
FIGS. 8a, 8b, 8c output voltage profiles from a light receiver provided in a light detector for movement of an object through the plane of detection of the light detector.

In this respect, both the light receivers 44 and 46 deliver respective output signals $E_1$ and $E_2$ as is shown for instance in FIG. 8a. In this figure, the voltage level delivered by each of the light receivers 44 and 46 is depicted against the distance between the object 48 and the light detector 42.

The figure shows that the spot of light reflected off the object 48 is at first only received by one light receiver, then from both light receivers each to a contribution varying with the distance of the object 48, and subsequently only from the second light receiver. The object 48 is located in the plane of detection when both light detectors receive approximately the same light contribution, as is the case in FIG. 7 when the distance d is equal to $d_1$.

Figure 8B:
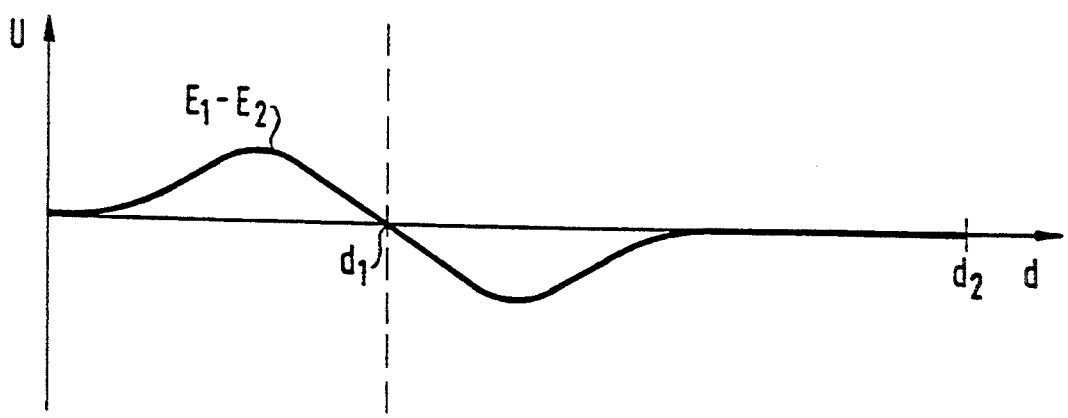

Preferably, the different signal $E_1-E_2$ shown in FIG. 8b is fed to the comparator circuit provided in the light detector.

Figure 8C:
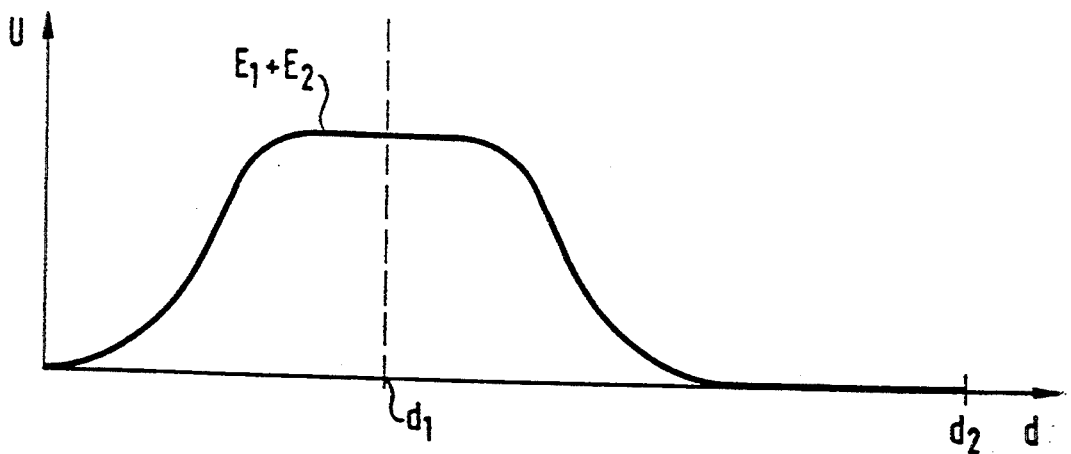

When using this difference signal $E_1-E_2$, it is not possible to tell if the object 48 is at a distance $d_1$ or at a distance $d_2$. In order to circumvent this difficulty, the summation signal $E_1+E_2$ shown in FIG. 8c is additionally used in the light detector for the processing.

If the summation signal $E_1+E_2$ shown in FIG. 7c is not equal to zero and the difference signal $E_1-E_2$ shown in FIG. 8b is equal to zero, then the object is located in the plane of detection at the distance $d_1$ from the light detector 42.

If the difference signal $E_1-E_2$ and the summation signal $E_1+E_2$ are both equal to zero, then no light is being reflected to the light detector 42 and the object 48 is located for instance at a distance $d_2$ from the light detector 42.

I claim:

1. Comparator circuit, for triggering a switching event when a rising or falling electrical input signal ($U_E$) passes through a switching threshold, comprising a signal input and one signal output having a first switching state and a second switching state, wherein the first switching state represents a level of the input signal lying above the switching threshold and the second switching state represents a level of the input signal lying below the switching threshold, characterized in that
    a first comparator and a second comparator are provided in the comparator circuit, each comparator having one signal input, one reference input and one signal output, the one signal input of each comparator being acted upon by the input signal ($U_E$) and the reference inputs of each comparator being connected in such a manner that the first comparator switches on when the switching threshold is exceeded by the input signal ($U_E$) and switches off only when a first auxiliary threshold is undershot by the input signal $U_E$, the first auxiliary threshold being chosen to be smaller than the switching threshold and in such a manner that the second comparator (2) switches on when a second auxiliary threshold is exceeded by the input signal ($U_E$), the second auxiliary threshold being chosen to be larger than the switching threshold and switches off only when the switching threshold is undershot by the input signal $U_E$; and in that
    the signal outputs of both the first comparator and of the second comparator are coupled to a logic circuit which produces an output signal ($U_A$) of the logic circuit corresponding to an ON-state of the comparator circuit when the first comparator is switched on and which produces an output signal ($U_A$) of the logic circuit corresponding to an OFF-state of the comparator circuit when the second comparator is switched off, wherein a difference between the first and the second auxiliary thresholds is chosen to be sufficiently large so that an unstable switching behavior of the comparator circuit caused by interference signals superposed on the input signal is avoided.

2. Comparator circuit in accordance with claim 1, characterized in that
    the input signal ($U_E$) is applied to the signal inputs of each of the comparators via a capacitance.

3. Comparator circuit in accordance with claim 1, characterized in that
    a switching voltage ($V_s$), a first auxiliary threshold voltage ($V_L$) and a second auxiliary threshold voltage ($V_H$) corresponding to the switching threshold, the first auxiliary threshold and the second auxiliary threshold respectively, are taken off a common voltage divider.

4. Comparator circuit in accordance with claim 3, characterized in that
    the reference input of the first comparator and the reference input of the second comparator are connected to the switching voltage ($V_s$) corresponding to the switching threshold via a common resistor.

5. Comparator circuit in accordance with claim 1, characterized in that
    a switching voltage ($V_s$) and a first auxiliary threshold voltage ($V_L$) corresponding to the switching threshold and to the first auxiliary threshold, respectively, are applied to
    the reference input of the first comparator via a first pair of exclusively activated switches, and in that the switching voltage ($V_s$) and a second auxiliary voltage ($V_H$) corresponding to the switching threshold and the second auxiliary threshold, respectively, are connected to the reference input of the second comparator via a second pair of exclusively activated switches.

6. Comparator circuit in accordance with claim 1, characterized in that
    the first and second comparators have a first D-type flip-flop and a second D-type flip-flop respectively associated therewith and in that the signal output of each comparator is fed to its respective D-type flip-flop, and in that each D-type flip-flop has an output (Q) which is applied to a respective input of the logic circuit.

7. Use of a comparator circuit in accordance with claim 1 in a light detector for signalling presence of an object in a plane of a detection at a predetermined distance from the light detector, characterized in that
    the light detector comprises a light emitter and two neighbouring light receivers which receive light reflected from the object, wherein, when the object is approaching the light detector, the light is initially only received by one light receiver, then from both light receivers each to a contribution which changes according to the distance of the object and eventually is received only by the second light receiver, the object being located in the plane of detection whenever both light receivers receive an approximately similar light contribution, and wherein a difference signal ($E_1-E_2$) of signals delivered from both light receivers is fed to the comparator circuit as the input signal ($U_E$).

8. Comparator circuit, for triggering a switching event when a rising or falling electrical input signal ($U_E$) passes through a switching threshold, comprising a signal input and one signal output having a first switching state and a second switching state, wherein the first switching state represents a level of the input signal lying above the switching threshold and the second switching state represents a level of the input signal lying below the switching threshold, characterized in that
    a first comparator and a second comparator are provided in the comparator circuit, each comparator having one signal input, one reference input and one signal output, the one signal input of each comparator being acted upon by the input signal (UE) and the reference input of each comparator being connected in such a manner that the first comparator switches on when the switching threshold is exceeded by the input signal (UE) and switches off only when a first auxiliary threshold is undershot by the input signal (UE), the first auxiliary threshold being chosen to be smaller than the switching threshold in such a manner that the second comparator switches on when a second auxiliary threshold is exceeded by the input signal ($U_E$), the second auxiliary threshold being chosen to be larger than the switching threshold and switches off only when the switching threshold is undershot by the input signal ($U_E$), and in such a manner that the signal outputs of both the first comparator and of the second comparator are coupled to a logic circuit which produces an output signal of the logic circuit corresponding to an ON-state of the comparator circuit when the first comparator is switched on and which produces an output signal ($U_A$) of the logic circuit corresponding to an OFF-state of the comparator circuit when the second comparator is switched off, wherein a difference between the first and the second auxiliary thresholds is chosen to be sufficiently large so that an unstable switching behavior of the comparator circuit caused by interference signals superposed on the input signal is avoided; and in that the first and second comparators have a first D-type flip-flop and a second D-type flip-flop respectively associated therewith and in that the signal output of each comparator is fed to its respective D-type flip-flop, and in that each D-type flip-flop has an output (Q) which is applied to a respective input of the logic circuit.

9. Comparator circuit in accordance with claim 8, characterized in that each D-type flip-flop also has an inverted output ($\overline{Q}$) and in that;

both outputs (Q, $\overline{Q}$) of the first D-type flip-flop control a position of a first pair of activated switches, the first pair being connected to the reference input of the first comparator, in such a manner that, when the first comparator is switched off, a switching voltage ($V_s$) corresponding to the switching threshold is applied to the reference input of the first comparator and when the first comparator is switched on, a first auxiliary voltage ($V_L$) corresponding to the first auxiliary threshold is applied to the reference input of the first comparator; and in that both outputs (Q, $\overline{Q}$) of the second D-type flip-flop control the position of a second pair of exclusively activated switches, the second pair being connected to the reference input of the second comparator, in such a manner that, when the second comparator is switched off, a second auxiliary voltage ($V_H$) corresponding to the second auxiliary threshold is applied to the reference input of the second comparator and when the second comparator is switched on, the switching voltage ($V_s$) corresponding to the switching threshold is applied to the reference input of the second comparator.

10. Comparator circuit in accordance with claim 8, characterized in that the D-type flip-flops are clocked at a common frequency.

11. Comparator circuit in accordance with claim 8, characterized in that the logic circuit has an output signal ($U_A$) and comprises a JK-flip-flop there being applied to a SET-input of the JK-flip-flop via a first AND-gate:

an output signal ($U_1$) of the second D-type flip-flop (14), the output signal ($\overline{U}_A$) of the logic circuit inverted by a first inverter, and an output signal ($\overline{U}_2$) of the first D-type flip-flop inverted by a second inverter, and there being applied to a RESET-input of the JK-flip-flop via a second AND-gate:

the output signal ($U_1$) of the second D-type flip-flop, the output signal ($U_A$) of the logic circuit, and the output signal ($\overline{U}_2$) of the first D-type flip-flop inverted by the second inverter.

12. Comparator circuit in accordance with claim 11, characterized in that the JK-flip-flop is clocked by every change of $U_1$ and/or $U_2$.

13. Comparator circuit in accordance with claim 11, characterized in that an OR gate is interposed within the logic circuit such that an output of the OR gate is connected to the SET-input of the JK flip-flop, a first input of the OR gate is connected to an output of the first AND gate and a second input of the OR gate is connected to a signal which effects a setting of the JK-flip-flop whenever a voltage of the input signal ($U_E$) of the comparator circuit decreases from a value above the switching voltage ($V_s$) to a value between the switching threshold ($V_s$) and the first auxiliary threshold ($V_L$) and subsequently climbs above the second auxiliary threshold ($V_H$).

14. Comparator circuit in accordance with claim 11, characterized in that, an OR gate is interposed within the logic circuit (15) such that an output of the OR gate is connected to the RESET-input of the JK flip-flop (29), a first input of the OR gate is connected to an output of the second AND gate and a second input of the first OR gate is connected to a signal which effects a resetting of the JK-flip-flop whenever a voltage of the input signal ($U_E$) of the comparator circuit climbs from a value below the switching threshold ($V_s$) to a value between the switching threshold ($V_s$) and the second auxiliary threshold ($V_H$) and subsequently decreases to below the first auxiliary threshold ($V_L$).

15. Use of a comparator circuit in accordance with claim 8 in a light detector for signalling presence of an object in a plane of detection at a predetermined distance from the light detector, characterized in that the light detector comprises a light emitter and two neighbouring light receivers which receive light reflected from the object, wherein, when the object is approaching the light detector, the light is initially only received by one light receiver, then from both light receivers each to a contribution which changes according to the distance of the object and eventually is received only by the second light receiver, the object being located in the plane of detection whenever both light receivers receive an approximately similar light contribution, and wherein a difference signal ($E_1 - E_2$) of signals delivered from both light receivers is fed to the comparator circuit as input signal ($U_E$).

16. Use of a comparator circuit in accordance with claim 15, characterized in that
the light emitter emits pulse-shaped signals and in that a pulse frequency of the pulse-shaped signals is used to clock the D-type flip-flops disposed in the circuit arrangement.

17. Comparator circuit, for triggering a switching event when a rising or falling electrical input signal ($U_E$) passes through a switching threshold, comprising a signal input and one signal output having a first switching state and a second switching state, wherein the first switching state represents a level of the input signal lying above the switching threshold and the second switching state represents a level of the input signal lying below the switching threshold, characterized in that
a first comparator and a second comparator are provided in the comparator circuit, each comparator having one signal input, one reference input and one signal output, the one signal input of each comparator being acted upon by the input signal ($U_E$) and the reference input of each comparator being connected in such a manner that the first comparator switches on when the switching threshold is exceeded by the input signal ($U_E$) and switches off only when a first auxiliary threshold is undershot by the input signal (UE), the first auxiliary threshold being chosen to be smaller than the switching threshold in such a manner that the second comparator switches on when a second auxiliary threshold is exceeded by the input signal ($U_E$), the second auxiliary threshold being chosen to be larger than the switching threshold and switches off only when the switching threshold voltage is undershot by the input signal ($U_E$);
and in such a manner that the signal outputs of both the first comparator and of the second comparator are coupled to a logic circuit which produces an output signal ($U_A$) of the logic circuit corresponding to an ON-state of the comparator circuit when the first comparator is switched on and which produces an output signal ($U_A$) of the logic circuit corresponding to an OFF-state of the comparator circuit when the second comparator is switched off, wherein a difference between the first and the second auxiliary thresholds is chosen to be sufficiently large so that an unstable switching behavior of the comparator circuit caused by interference signals superposed on the input signal is avoided; and in that
a switching voltage ($V_s$), a first auxiliary threshold voltage ($V_L$) and a second auxiliary threshold voltage ($V_H$), corresponding to the switching threshold, the first auxiliary threshold, and the second auxiliary threshold respectively, are taken off a common voltage divider and
the reference input of the first comparator and the reference input of the second comparator are connected to the switching voltage ($V_s$) corresponding to the switching threshold via a common resistor.

18. Comparator circuit, for triggering a switching event when a rising or falling electrical input signal ($U_E$) passes through a switching threshold, comprising a signal input and one signal output having a first switching state and a second switching state, wherein the first switching state represents a level of the input signal lying above the switching threshold and the second switching state represents a level of the input signal lying below the switching threshold, characterized in that a first comparator and a second comparator are provided in the comparator circuit, each comparator having one signal input, one reference input and one signal output, the one signal input of each comparator being acted upon by the input signal ($U_E$) and the reference input of each comparator being connected in such a manner that the first comparator switches on when the switching threshold is exceeded by the input signal ($U_E$) and switches off only when a first auxiliary threshold is undershot by the input signal ($U_E$), the first auxiliary threshold being chosen to be smaller than the switching threshold in such a manner that the second comparator switches on when a second auxiliary threshold voltage is exceeded by the input signal ($U_E$), the second auxiliary threshold voltage being chosen to be larger than the switching threshold voltage and switches off only when the switching threshold voltage is undershot by the input signal ($U_E$)
and in such a manner that the signal outputs of both the first comparator and of the second comparator are coupled to a logic circuit which produces an output signal ($U_A$) of the logic circuit corresponding to an ON-state of the comparator circuit when the first comparator is switched on and which produces an output signal ($U_A$) of the logic circuit corresponding to an OFF-state of the comparator circuit when the second comparator is switched off, wherein a difference between the first and the second auxiliary thresholds is chosen to be sufficiently large so that an unstable switching behavior of the comparator circuit caused by interference signals superposed on the input signal is avoided; and in that
a switching voltage ($V_s$) and a first auxiliary threshold voltage ($V_L$) corresponding to the switching threshold and to the first auxiliary threshold, respectively, are applied to the reference input of the first comparator via a first pair of exclusively activated switches, and in that the switching voltage ($V_s$) and a second auxiliary voltage ($V_H$) corresponding to the switching threshold and the second auxiliary threshold, respectively, are connected to the reference input of the second comparator via a second pair of exclusively activated switches.

19. A comparator circuit coupled to a light detector for signalling presence of an object in a plane of detection at a predetermined distance from the light detector triggering a switching event characterized in that the comparator circuit triggers a switching event when a rising or falling electrical input signal ($U_E$) passes through a switching threshold and comprises a signal input and one signal output having a first switching state and a second switching state, wherein the first switching state represents a level of the input signal lying above the switching threshold and the second switching state represents a level of the input signal lying below the switching threshold; in that
a first comparator and a second comparator are provided in the comparator circuit, each comparator having one signal input, one reference input and one signal output, the one signal input of each comparator being acted upon by the input signal ($U_E$) and the reference input of each comparator being connected in such a manner that the first comparator switches on when the switching threshold is exceeded by the input signal ($U_E$) and switches off only when a first auxiliary threshold is undershot by the input signal ($U_E$), the first auxiliary threshold being chosen to be smaller than the switching threshold and in such a manner that the second comparator switches on when a second auxiliary threshold is exceeded by the input signal ($U_E$), the second auxiliary threshold being chosen to be larger than the switching threshold and switches off only when the switching threshold is undershot by the input signal ($U_E$); in that the signal outputs of both the first comparator and of the second comparator are coupled to a logic circuit which produces an output signal ($U_A$) of the logic circuit corresponding to an ON-state of the comparator circuit when the first comparator is switched on and which produces an output signal ($U_A$) of the logic circuit corresponding to an OFF-state of the comparator circuit when the second comparator is switched off, wherein a difference between the first and the second auxiliary thresholds is chosen to be sufficiently large so that an unstable switching behavior of the comparator circuit caused by interference signals superposed on the input signal is avoided; and in that the light detector comprises a light emitter and two neighbouring light receivers which receive light reflected from the object, wherein, when the object is approaching the light detector, the light is initially only received by one light receiver, then from both light receivers each to a contribution which changes according to the distance of the object and eventually is received only by the second light receiver, the object being located in the plane of detection whenever both light receivers receive an approximately similar light contribution, and wherein a difference signal ($E_1-E2$) of signals delivered from both light receivers is fed to the comparator circuit as the input signal ($U_E$).

* * * * *